United States Patent [19]
Ong

[11] Patent Number: 6,154,386
[45] Date of Patent: Nov. 28, 2000

[54] MEMORY DEVICE HAVING A WIDE DATA PATH

[75] Inventor: Adrian E. Ong, Pleasanton, Calif.

[73] Assignee: G-Link Technology, Santa Clara, Calif.

[21] Appl. No.: 09/098,127

[22] Filed: Jun. 16, 1998

[51] Int. Cl.[7] ................................................ G11C 5/06
[52] U.S. Cl. ........................... 365/63; 365/72; 365/190
[58] Field of Search ............................ 365/203, 63, 69, 365/72, 190

[56] References Cited

U.S. PATENT DOCUMENTS

| | | | |
|---|---|---|---|
| 5,227,697 | 7/1993 | Sakagami | 365/203 |
| 5,233,560 | 8/1993 | Foss et al. | 365/203 |
| 5,355,343 | 10/1994 | Shu et al. | 365/203 |
| 5,367,488 | 11/1994 | An | 365/203 |
| 5,418,737 | 5/1995 | Tran | 365/63 |
| 5,475,642 | 12/1995 | Taylor | 365/203 |
| 5,485,419 | 1/1996 | Campbell | 365/69 |
| 5,561,630 | 10/1996 | Katoh et al. | 365/203 |
| 5,621,679 | 4/1997 | Seo et al. | 365/63 |
| 5,875,140 | 2/1999 | Merritt et al. | 365/203 |
| 5,894,440 | 4/1999 | Tsukude et al. | 365/190 |

*Primary Examiner*—Tan T. Nguyen
*Attorney, Agent, or Firm*—Skjerven, Morrill, MacPherson, Franklin & Friel; Philip Woo

[57] ABSTRACT

A memory device includes a plurality of bit lines, with each bit line serving at least one respective memory cell. A plurality of input/output lines are connected and parallel to the bit lines. The input/output lines allow data to be placed upon or extracted from the bit lines. Because the I/O lines are positioned parallel, rather than perpendicular, to the bit lines, the surface area required to implement the memory device does not increase in proportion to the number of bit lines provided. Accordingly, a relatively wide data path can be implemented on the memory device without significantly increasing the amount of surface area.

10 Claims, 3 Drawing Sheets

MEMORY DEVICE HAVING A WIDE DATA PATH

FIELD OF THE INVENTION

The present invention relates generally to the field of semiconductor integrated circuits, and more particularly, to a memory device having a wide data path.

BACKGROUND OF THE INVENTION

Integrated circuit (IC) memory devices allow large amounts of data to be stored in relatively small physical packages. A typical IC memory device comprises a plurality of memory cells. Separate bits of data may be written into, stored, and read out of each of these memory cells. Generally, the memory cells are each accessible by at least one data line, commonly referred to as a "bit line."

Recently, for IC devices, it has become desirable to have a "wide" data path which allows many memory cells to be accessed simultaneously. This is because certain applications, such as video, telecommunications, and Internet, require massive parallel read/write operations in order to provide high quality image, voice, data, and the like.

IC memory devices having a wide data path can be implemented with previously developed techniques. Specifically, according to such techniques, a number of input/output (I/O) lines can be provided perpendicular to the bit lines in a memory device. Each I/O line allows data to be placed upon or taken off one or more bit lines serving respective memory cells. In order to provide access to more memory cells simultaneously, the number of I/O lines may be increased.

As the number of I/O lines is increased, however, the surface area needed to implement an IC memory device also increases in direct proportion. This is due to the fact that the I/O lines are perpendicular to the bit lines and also to the fact that I/O lines cannot be overlapped with each other. Thus, with previously developed techniques, a wide data path can be achieved only at the cost of a significant increase in surface area.

SUMMARY

The disadvantages and problems associated with providing a wide data path on a memory device have been substantially reduced or eliminated using the present invention.

In accordance with one embodiment of the present invention, a memory device includes a bit line for accessing a memory cell. An input/output line is connected and parallel to the bit line. The input/output line allows data to be placed upon or extracted from the bit line.

An important technical advantage of the present invention includes providing an architecture for a memory device in which the input/output (I/O) lines are parallel to the bit lines. Each of the I/O lines is connected to one or more respective bit lines and allow simultaneous access to the memory cells served by the bit lines. In one embodiment, the bit lines may be implemented in a first layer on a silicon die and the I/O lines implemented in a layer above or below that in which the bit lines are implemented. Because the I/O lines are positioned parallel, rather than perpendicular, to the bit lines, the surface area required to implement the memory device does not increase in proportion to the number of bit lines provided. Accordingly, a relatively wide data path can be implemented on a memory device without significantly increasing the amount of surface area.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
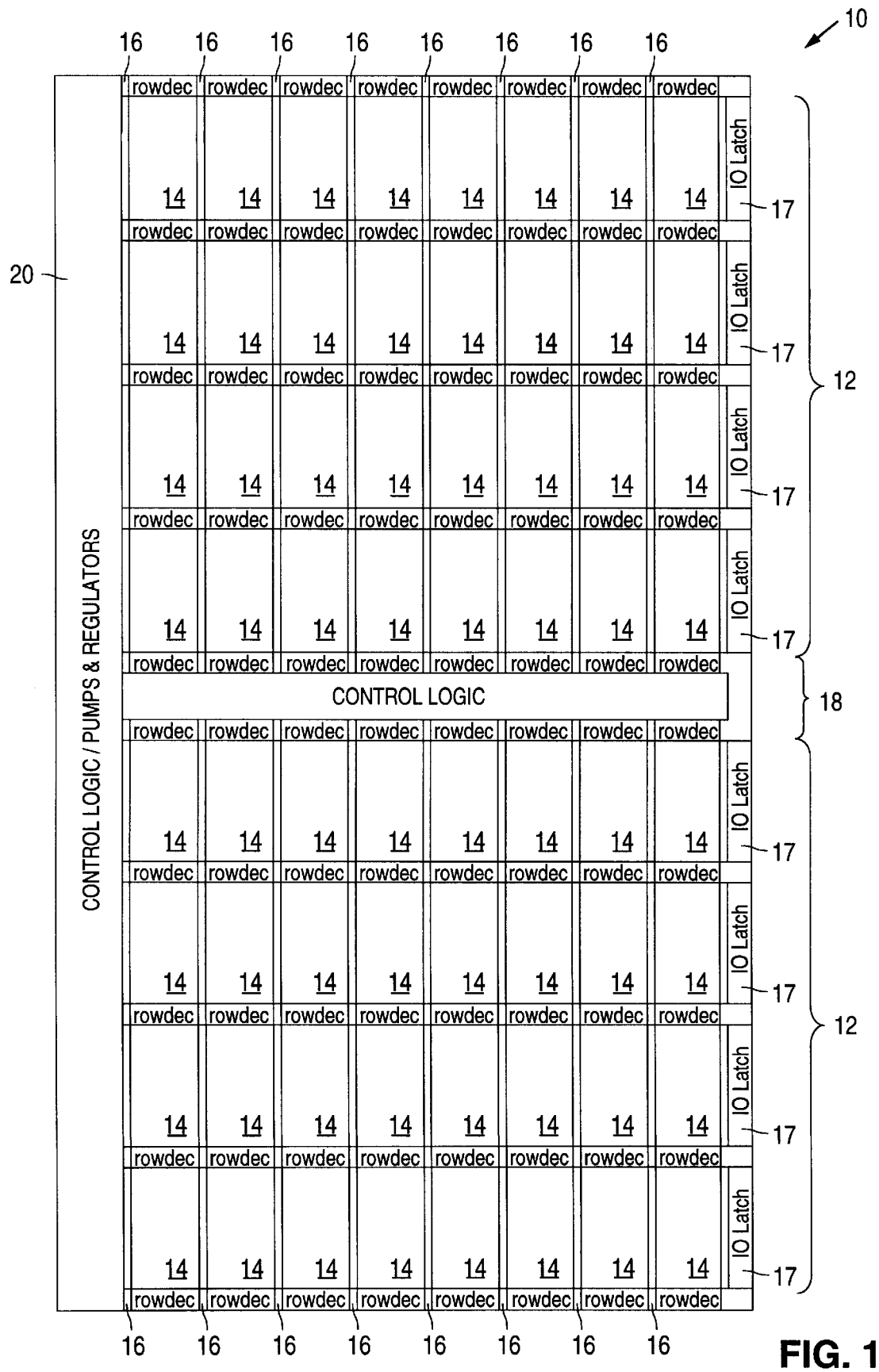
FIG. 1 illustrates an exemplary layout for an integrated circuit memory device into which an embodiment of the present invention can be incorporated.
Figure 2:
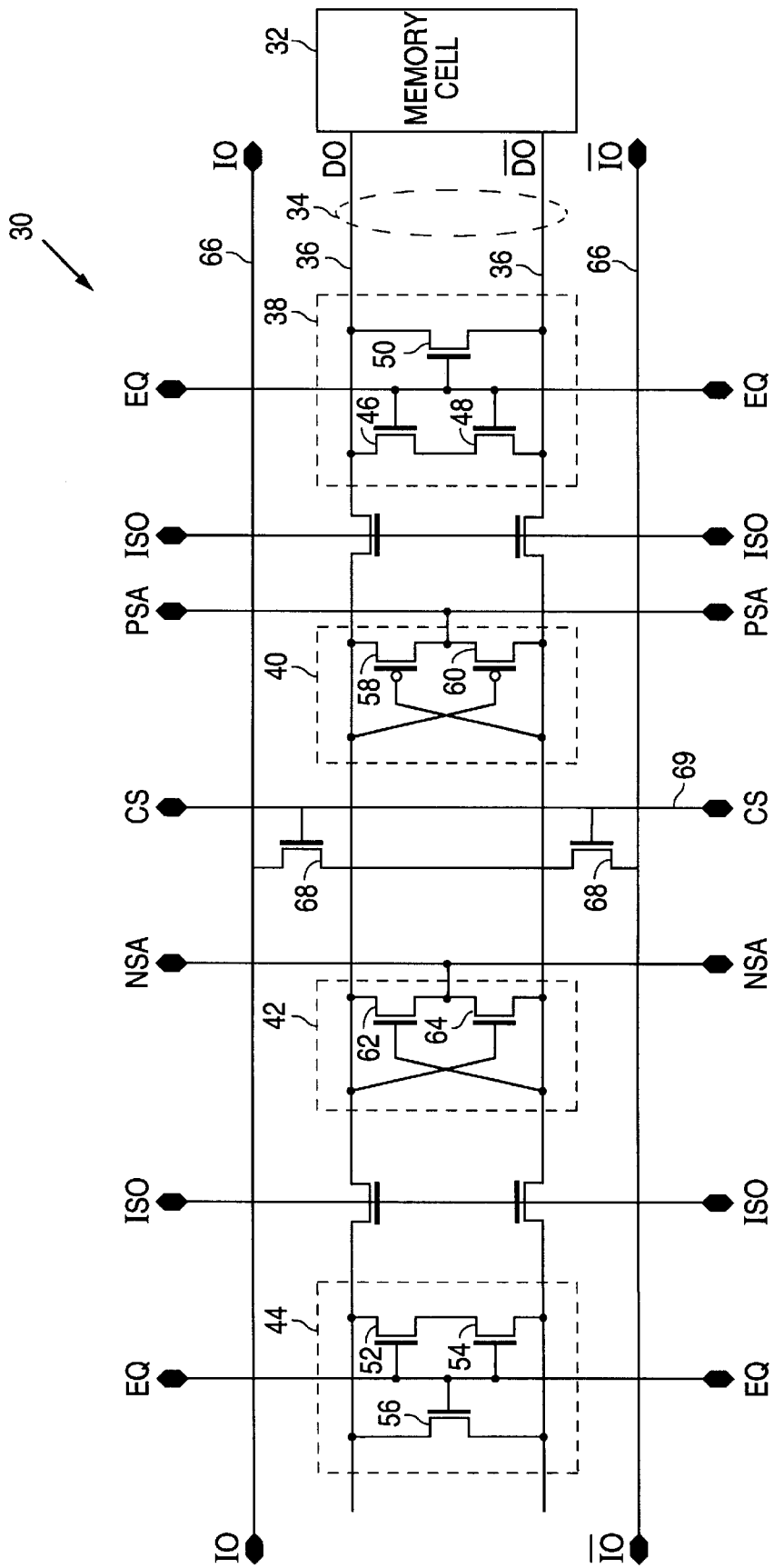
FIG. 2 is a schematic diagram of input/output lines parallel to bit lines, in accordance with an embodiment of the present invention.
Figure 3:
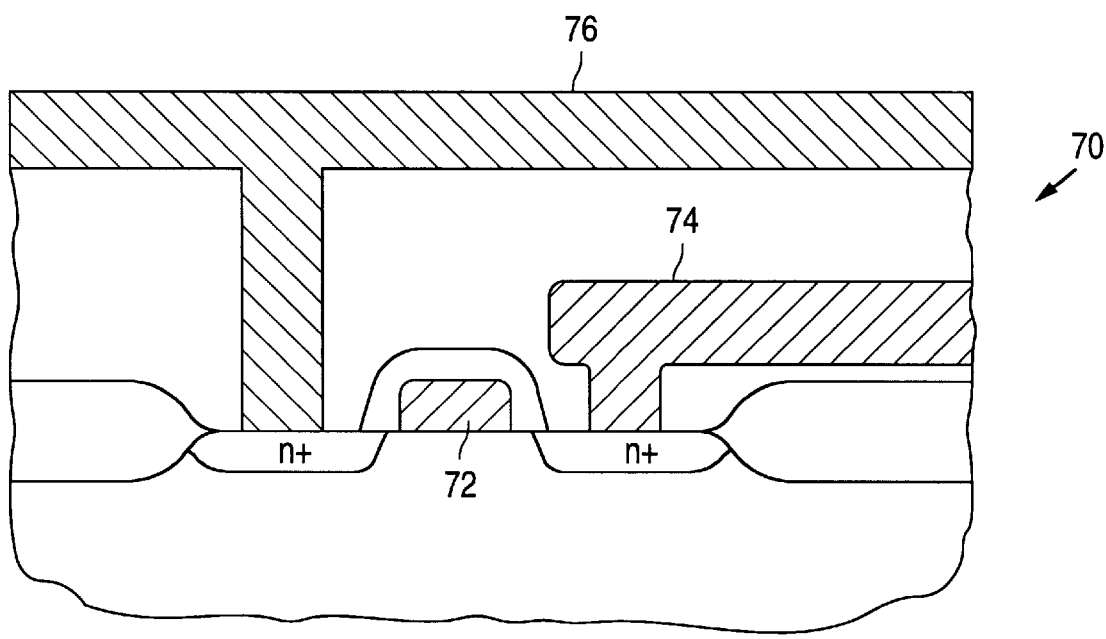
FIG. 3 is a cross-sectional view of a portion of an integrated circuit memory device, in accordance with an embodiment of the present invention.

The preferred embodiments of the present invention and their advantages are best understood by referring to FIGS. 1–3 of the drawings. Like numerals are used for like and corresponding parts in the various drawings.

FIG. 1 illustrates an exemplary layout for a memory device 10 into which an embodiment of the present invention can be incorporated. Memory device 10 can be any suitable volatile or non-volatile integrated circuit (IC) memory. For example, in one embodiment, memory device 10 comprises a dynamic random access memory (DRAM) in which data stored therein decays over time; accordingly, numerous refresh operations are required to maintain the integrity of the stored data. In another embodiment, memory device 10 may comprise a static memory (i.e., one that does not require refresh operations), such as a static random access memory (SRAM).

In general, memory device 10 includes one or more memory areas 12. As shown, memory device 10 comprises two such memory areas 12. These memory areas 12 are separated into a number of arrays 14, each of which comprises a plurality of memory cells. Each memory cell functions to maintain data. In particular, separate bits of data may be written into, stored, and read out of each of these memory cells. The memory cells may be fabricated in any suitable technology, such as metal-oxide semiconductor (MOS) technology, according to techniques well-known and understood by those skilled in the art of IC memory. The memory cells within an array 14 may be organized in a row-column format, wherein the rows are accessible by respective "word lines" and the columns are accessible by respective "bit lines." As shown, memory arrays 14 can also be organized into a number of rows within memory areas 12.

A plurality of pitch areas 16 are disposed around and between memory arrays 14. For clarity, only a portion of pitch areas 16 are labeled in FIG. 1. Each pitch area 16 comprises a number of circuits which support the writing, storage, access, and/or reading of information from memory arrays 14. For example, pitch. areas 16 may include one or more write amplifiers to drive (write) data into the memory and sense amplifiers to detect (read) the stored data. Furthermore, each pitch area 16 can include a number equilibration circuits for pre-charging voltages on bit lines in the memory arrays 14.

A plurality of input/output (I/O) latches 17 are located at one end of the memory areas 12. Each I/O latch 17 may comprise one or more sense amplifiers and write drivers for reading data into and writing data out of the memory cells in one row of memory arrays 14. Furthermore, I/O latches 17 may each comprise one or more I/O registers. This circuitry in I/O latches 17 can be coupled to a plurality of input/output (I/O) lines, which are described below in more detail.

A control logic area 18 and a control logic/pump and regulator area 20 are disposed along the borders of memory areas 12. Control logic area 18 and control logic/pump and regulator area 20 constitute peripheral circuitry for memory areas 12. Each of control logic area 18 and control logic/pump and regulator area 20 comprises one or more circuits which support the storage, maintenance, and/or access of information in memory areas 12. In particular, control logic area 18 may include a number of array drivers, row fuses, row address buffers, row decoders, column decoders, column address buffers, and the like for accessing memory cells in the memory areas 12. Control logic/pump and regulator section 20 may include input registers, and timing and control circuitry. In addition, this section may include various power sources and pumps to drive, and thereafter maintain, information in the memory cells of memory area 12. These include, for example, sources for Vcc, Vss, and Vbb.

In accordance with an embodiment of the present invention, multiple input/output (I/O) lines may be disposed parallel, and connected, to the bit lines in memory areas 12. The I/O lines allow data to be placed upon and extracted from the bit lines via I/O latches 17. Furthermore, the I/O lines can be formed in a layer lying above or below that in which the bit lines are formed. Details and advantages regarding these structures and arrangements between the I/O lines and the bit lines are described below with reference to FIGS. 2 and 3.

FIG. 2 is a schematic diagram of exemplary circuitry 30 in which I/O lines are disposed parallel to bit lines in a memory device, in accordance with an embodiment of the present invention. In a memory device, circuitry 30 can be replicated multiple times in a memory area, such as, for example, that shown in FIG. 1.

Circuitry 30 includes a memory cell 32, which is located in a memory array of the memory area. Data can be written into, stored, and read out of memory cell 32, as previously described. A bit line pair 34 is connected to memory cell 32. As used herein, the terms "connected," "coupled," or any variant thereof, means any connection or coupling, either direct or indirect, between two or more elements. Bit line pair 34 supports the writing and reading of data into and out of memory cell 32. Bit line pair 34 comprises two bit lines 36: one bit line 36 is provided for a binary "1" or high value of the data for the memory cell 32; the other bit line 36 is provided for the complement, comprising a binary "zero" or low value for the same data. Thus, as shown, data DO is accessible by one bit line 36 of bit line pair 34, while its complement $\overline{DO}$ is accessible by the other bit line 36.

A first equilibration circuit 38, a p-type sense amplifier 40, an n-type sense amplifier 42, and a second equilibration circuit 44 are sequentially coupled to bit line pair 34. First equilibration circuit 38 functions generally to pre-charge the two bit lines 36 of bit line pair 34 to a voltage level that is between ground and Vcc. First equilibration circuit 38 may comprise three n-type transistors 46, 48, and 50. The gates of all these transistors are connected together and they receive an equilibration (EQ) signal. The drains of each of transistors 46 and 50 are connected to one bit line 36 of bit line pair 34, and the sources of transistors 48 and 50 are connected to the other bit line 36. The source of transistor 46 and the drain of transistor 48 are connected together.

Second equilibration circuit 44 also functions to pre-charge the two bit lines 36 of bit line pair 34. Like first equilibration circuit 38, second equilibration circuit 44 comprises three n-type transistors 52, 54, and 56. The gates of all of these transistors are connected together and receive the equilibration (EQ) signal. The drains of transistors 52 and 56 are coupled to one bit line 36 up at line pair 34, while the sources of transistors 54 and 56 are connected to the other bit line 36. The source of transistor 52 and the drain of transistor 54 are connected together.

The p-type sense amplifier 40 functions to sense or read information stored within memory cell 32 supported by bit line pair 34. The p-type sense amplifier 40 comprises two p-type transistors 58 and 60 coupled between the two bit lines 36 of bit line pair 34. The gate of transistor 58 is connected to one bit line 36 while the gate of transistor 60 is connected to the other bit line 36. The source of transistor 58 is connected to the bit line 36 opposite that to which its gate is coupled. The drain of transistor 58 is connected to the source of transistor 60, at which point a p-type sense amplifier (PSA) latch signal is applied. The drain of transistor 60 is connected to the bit line 36 opposite that to which its gate coupled.

The n-type sense amplifier 42 generally performs the same function as p-type sense amplifier 40—i.e., to sense or read information stored within memory cell 32 supported by bit line pair 34. The n-type sense amplifier 42 comprises two n-type transistors 62 and 64. The gate of each n-type transistor is connected to one of bit lines 36 of bit line pair 34. The drain of transistor 62 is connected to the bit line 36 opposite that to which its gate is coupled. The source of transistor 62 is connected to the drain of transistor 64, at which point an n-type sense amplifier (NSA) latch signal may be applied. The source of transistor 64 is connected to the bit line 36 opposite that to which its gate is coupled.

Two I/O lines 66 are parallel and connected to respective bit lines 36 of bit line pair 34. I/O lines 66 allow data to be placed upon or extracted from the respective bit line 36. Each I/O line 66 is coupled to the respective bit line 36 via a separate n-type transistor 68. In particular, the source and drain of each transistor 68 are connected to bit line 36 and I/O line 66. The gate of each transistor 68 is connected to a column select line 69 for receiving a column select (CS) signal. Column select line 69 can be perpendicular to bit lines 36 and I/O lines 66.

In operation, data can be moved between bit lines 36 and I/O lines 66 for the reading and writing of such data to and from memory cell 32. To accomplish this, a high voltage is applied at the CS signal, thus turning on transistors 68. With transistors 68 turned on, each bit line is electrically connected to the respective I/O line 66, thereby allowing data to be transferred therebetween.

It should be understood that the embodiment depicted in FIG. 1, and its corresponding operation, are merely exemplary. Thus, with other embodiments, circuitry in which I/O lines are disposed parallel to bit lines may include multiple bit lines for each I/O line. Also, in other embodiments, multiple C/S lines may be provided. For example, in one particular embodiment, two bit line pairs may be supported by a single I/O line pair, and two C/S lines are provided for selecting one of the bit line pairs for data transfer to the I/O line pair. In this embodiment, the I/O lines are not on pitch with the bit lines.

The arrangement of circuitry 30 is advantageous for implementing a wide data path on a memory device. In particular, because I/O lines 66 are positioned parallel, rather than perpendicular, to bit lines 36, the number of I/O lines on the memory device can be increased without a corresponding increase in the amount of surface area required to implement the memory device. Furthermore, if a separate I/O line is provided for each bit line, a "block write" or a "block read" along all bit lines can be accomplished.

FIG. 3 is a cross-sectional view of a portion 70 of an integrated circuit memory device, in accordance with an embodiment of the present invention. Within the depicted portion 70, a column select line 72 can be formed in a first polysilicon ("poly1") layer. A bit line 74 may be formed in a second polysilicon (poly2") layer. As shown, bit line 74 is perpendicular to column select line 72. An I/O line 76 can be formed in a metal layer disposed above the poly2 layer in which bit line 74 is formed. As shown, I/O line 76 is formed in a "metal1" layer. It should be understood, however, that in other embodiments, I/O line 76 can be formed in a "metal2" layer or another suitable layer. I/O line 76 is parallel to bit line 74. With this arrangement in which I/O lines (e.g., I/O line 76) are formed in a layer lying above or below that in which bit lines (e.g., bit line 74) are formed, the savings in surface area are increased even more.

Although the present invention and its advantages have been described in detail, it should be understood that various changes, substitutions, and alterations can be made therein without departing from the spirit and scope of the invention as defined by the appended claims.

What is claimed is:

1. A memory device comprising:

a bit line for accessing a memory cell;

an input/output line parallel to the bit line; and a column select line connected and perpendicular to the bit line and the input/output line, the column select line for enabling a transfer of data between the bit line and the input/output line;

wherein the column select line is formed in a first polysilicon layer of the memory device, the select line is formed in a second polysilicon layer of the memory device, and the input/output line is formed in a metal layer of the memory device, the metal layer lying above the first and second polysilicon layers.

2. The memory device of claim 1, further comprising:

a transistor connected between the bit line and the input/output line; and a column select line connected to a gate of the transistor, the column select line for applying a signal to the gate of the transistor, thereby enabling the transfer of data between the bit line and the input/output line.

3. The memory device of claim 1, further comprising an equilibration circuit connected to the bit line, the equilibration circuit for pre-charging the bit line.

4. The memory device of claim 1, further comprising a sense amplifier connected to the bit line, the sense amplifier for reading data stored in the memory cell.

5. The memory device of claim 1, further comprising:

a first equilibration circuit connected to the bit line; and a second equilibration circuit connected to the bit line, wherein the second equilibration circuit cooperates with the first equilibration circuit for pre-charging the bit line.

6. The memory device of claim 1, further comprising an input/output latch coupled to the input/output line.

7. A memory device comprising:

a memory array comprising a matrix of memory cells;

a plurality of bit lines, each bit line serving at least one respective memory cell in the memory array;

a plurality of input/output lines, each input/output line parallel with at least one bit line; and at least one column select line connected and perpendicular to at least a portion of the bit lines and the input/output lines, the at least one column select line for enabling the transfer of data between the bit lines and the input/output lines;

wherein at least one column select line is formed in a first polysilicon layer of the memory device, at least one bit line is formed in a second polysilicon layer of the memory device, and at least one input/output line is formed in a metal layer of the memory device, the metal layer lying above the first and second polysilicon layers.

8. The memory device of claim 7, further comprising at least one input/output latch.

9. The memory device of claim 7, further comprising a plurality of equilibration circuits connected to respective bit lines, the equilibration circuits for pre-charging the respective bit lines.

10. The memory device of claim 7, further comprising a plurality of sense amplifiers connected to respective bit lines, the sense amplifiers for reading data stored in the memory cells.

* * * * *